(12) United States Patent
Li

(10) Patent No.: US 9,356,160 B2
(45) Date of Patent: May 31, 2016

(54) FLAT PANEL SENSOR AND FLAT PANEL DETECTOR

(71) Applicant: Beijing BOE Optoelectronics Technology Co., Ltd., Beijing (CN)

(72) Inventor: Xiaokun Li, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 13/955,651

(22) Filed: Jul. 31, 2013

(65) Prior Publication Data

US 2014/0034950 A1 Feb. 6, 2014

(30) Foreign Application Priority Data

Aug. 3, 2012 (CN) .......................... 2012 2 0384818

(51) Int. Cl.
*H01L 29/04* (2006.01)
*H01L 31/02* (2006.01)
*H01L 29/786* (2006.01)
*H01L 27/146* (2006.01)
*H01L 27/12* (2006.01)

(52) U.S. Cl.
CPC ............ *H01L 31/02* (2013.01); *H01L 27/1255* (2013.01); *H01L 27/14658* (2013.01); *H01L 29/786* (2013.01)

(58) Field of Classification Search
CPC ...... H01L 27/3262–27/3269; H01L 27/14658; H01L 27/14643–27/14676; H01L 31/101–31/1013; H01L 31/117
See application file for complete search history.

(56) References Cited

U.S. PATENT DOCUMENTS

| 6,380,007 | B1* | 4/2002 | Koyama ...................... 438/151 |
| 2003/0038241 | A1* | 2/2003 | Choo et al. ............... 250/370.09 |
| 2003/0201450 | A1* | 10/2003 | Yamazaki et al. .............. 257/88 |
| 2009/0072122 | A1* | 3/2009 | Tada et al. ................. 250/208.1 |

* cited by examiner

*Primary Examiner* — David Vu
*Assistant Examiner* — Cuong Nguyen

(57) ABSTRACT

A flat panel sensor and a flat panel detector are provided on the basis of a top-gate TFT structure. The flat panel sensor comprises a base substrate, and a top-gate TFT and a storage capacitor that are formed on the base substrate; the storage capacitor includes a first conductive layer, a second conductive layer disposed in opposition to the first conductive layer, a third conductive layer for output of an electric signal, and a ground line; the first conductive layer is directly connected to a drain electrode and an active layer of the top-gate TFT, the second conductive layer is directly connected to the ground line, and the third conductive layer is connected to the first conductive layer through a via hole.

12 Claims, 4 Drawing Sheets

FLAT PANEL SENSOR AND FLAT PANEL DETECTOR

CROSS REFERENCE TO RELATED APPLICATIONS

This application claims priority from Chinese National Application No. 201220384818.4 filed on Aug. 3, 2012, the contents of which are incorporated herein by reference.

BACKGROUND

Embodiments of the present disclosure relate to a flat panel sensor and a flat panel detector.

X-ray flat panel detectors play more and more important roles in the fields of medical imaging, material testing and inspection, airport or seaport security inspection, transportable battlefield use, and so on.

The structure of a conventional X-ray sensor of a flat-panel type is shown in FIG. 1(a). The conventional X-ray sensor comprises a plurality of pixel units that are arranged in an array, and each of the pixel units includes one photodiode 11 and one thin film transistor (TFT) 12. As for the TFT 12, its gate electrode is connected to a corresponding gate scan line 13 of the X-ray sensor, its drain electrode is connected to a corresponding data line 14 of the X-ray sensor, and its source electrode is connected to the photodiode 11. One terminal of the data line 14 is connected to a data drive circuit 15 via a connecting pin.

Through scan signals applied by a scan drive circuit 16, the conventional X-ray sensor controls the switching status of the TFTs 12. When the TFT 12 of one pixel unit is switched on, a photocurrent signal that is formed by the photodiode 11 sequentially passes through the data line 14, which are connected to the TFT 12, and the data drive circuit 15 and is read out. Acquisition of the photoelectric signals is accomplished by means of controlling the signal timings on the gate scan line 13 and the data line 14; namely, an operation that controls acquisition of the photocurrent signal formed by the photodiode 11 is accomplished by means of controlling the switching status of the corresponding TFT 12.

A cross-sectional view of one pixel unit in a conventional X-ray sensor of a bottom-gate type is shown in FIG. 1(b). The pixel unit includes: a base substrate 1, a gate electrode 2, a common electrode 3, a drain electrode 4, a source electrode 5, an active layer 6, a passivation layer 7, an indium tin oxide (ITO) layer 8, a gate protecting layer 9, and a planarization layer 10. The ITO layer 8 is connected to the source electrode 5 through a via hole. The formation of the via hole needs exposure, development and other processes, and moreover fabrication of two PVX layers is required, so that the process is complex and the cost is relatively high.

SUMMARY

Embodiments of the disclosure provide a flat panel sensor and a flat panel detector that can be formed with simple processes and at low costs.

In an aspect of the disclosure, there is provided a flat panel sensor, comprising a base substrate, and a top-gate TFT and a storage capacitor that are formed on the base substrate; the storage capacitor includes a first conductive layer, a second conductive layer disposed in opposition to the first conductive layer, a third conductive layer for output of an electric signal, and a ground line, the first conductive layer is directly connected to a drain electrode and an active layer of the top-gate TFT, the second conductive layer is directly connected to the ground line, and the third conductive layer is connected to the first conductive layer through a via hole.

In another aspect of the disclosure, there is provided a flat panel detector, comprising the aforesaid flat panel sensor.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

The present disclosure will become more fully understood from the detailed description given hereinafter and the accompanying drawings which are given by way of illustration only, and thus are not limitative of the present disclosure and wherein.

DETAILED DESCRIPTION

Figure 1A:
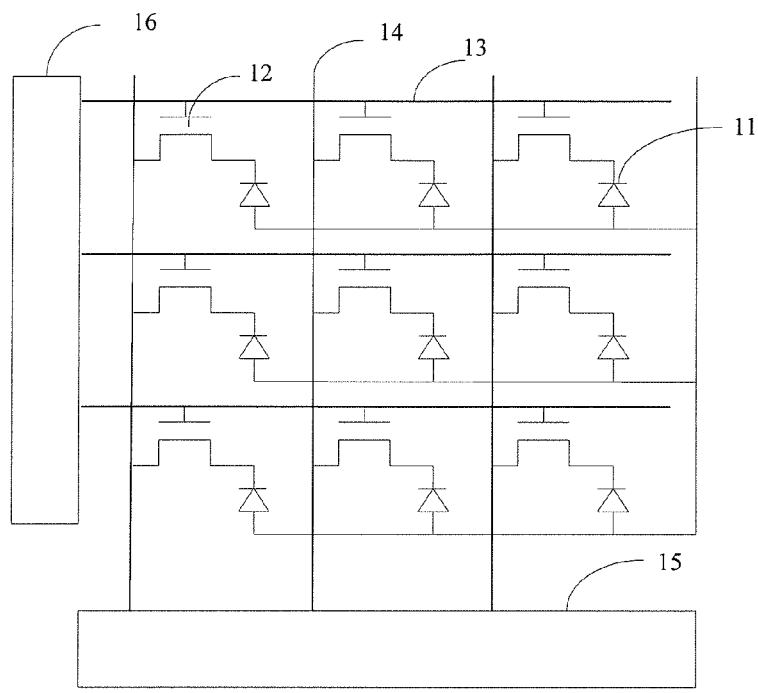
FIG. 1(a) is a structurally schematic view showing a conventional X-ray sensor.
Figure 1B:
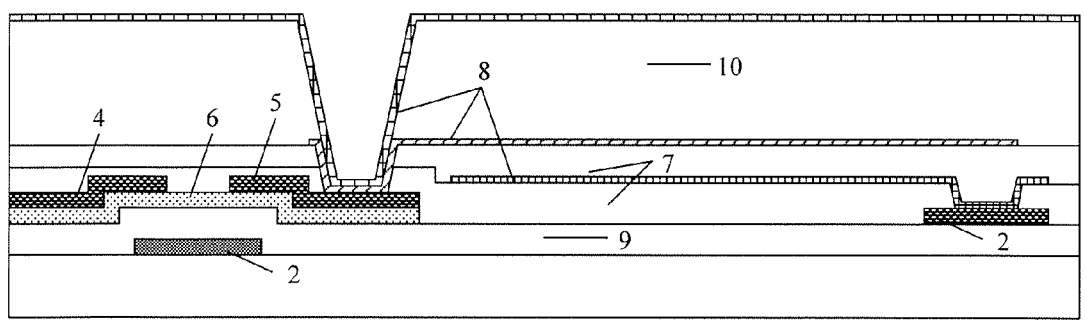
FIG. 1(b) is a cross-sectional view showing one pixel unit in a conventional X-ray sensor of a bottom-gate type.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms such as "a," "an," "the" etc., are not intended to limit the amount, but indicate the existence of at lease one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

According to an embodiment of the disclosure, there is provided a flat panel sensor, comprising a base substrate, and a top-gate TFT and a storage capacitor that are formed on the base substrate; the storage capacitor includes a first conductive layer, a second conductive layer disposed in opposition to the first conductive layer, a third conductive layer for output of an electric signal, and a ground line; the first conductive layer is directly connected to a drain electrode and an active layer of the top-gate TFT, the second conductive layer is directly connected to the ground line, and the third conductive layer is connected to the first conductive layer through a via hole.

In an example, the ground line is disposed on the same layer as a gate electrode of the top-gate TFT.

In an example, the ground line is formed on the second conductive layer and electrically contact with the second conductive layer.

In an example, in a region corresponding to the top-gate TFT, there is provided a light shielding layer.

In an example, the light shielding layer is disposed on the base substrate and located under the active layer.

In an example, the active layer is an amorphous silicon layer, a polysilicon layer or an oxide semiconductor layer.

In an example, a gate electrode of the top-gate TFT is formed of an aluminum material, a copper material, such as aluminum or an aluminum alloy, copper or a copper alloy, or the like.

In an example, the first to third conductive layers are all transparent conductive layers.

In an example, the second conductive layer and the third conductive layer are disposed in opposition to each other at least in part.

According to another embodiment of the disclosure, there is further provided a flat panel detector, comprising at least one aforesaid flat panel sensor.

The flat panel sensor and the flat panel detector according to embodiments of the disclosure are, for example, an X-ray flat panel sensor and an X-ray flat panel detector.

Embodiment 1

According to a first embodiment of the disclosure, there is provided an X-ray flat panel sensor, comprising a plurality of gate lines and a plurality of data lines that are arranged to intersect each other, and a plurality of pixel units stated as above, which are formed by enclosing them with the gate lines and the data lines. For example, each of the pixel units includes a photosensitive element, a thin film transistor (TFT) and a storage capacitor.

Figure 2A:
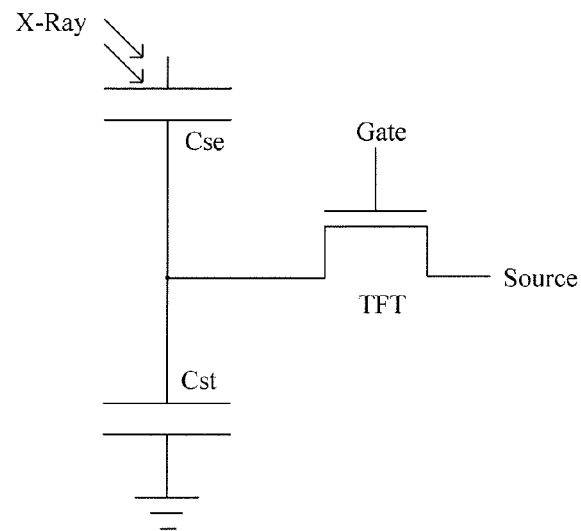
FIG. 2(a) is an equivalent circuit diagram showing each pixel unit of a TFT flat panel sensor according to an embodiment of the disclosure.

FIG. 2(a) is an equivalent circuit diagram showing each pixel unit of a TFT flat panel sensor according to the embodiment of the disclosure. As shown in FIG. 2(a), Cse indicates a photosensitive element, such as a photodiode, for sensing a photoelectric signal formed by irradiation of X ray; TFT is an example of a switch element; and Cst indicates a storage capacitor. For example, a gate electrode of the TFT is connected to a corresponding gate line of the pixel unit, a source electrode of the TFT is connected to a corresponding data line of the pixel unit, and a source electrode of the TFT is connected to the photodiode.

Figure 2B:
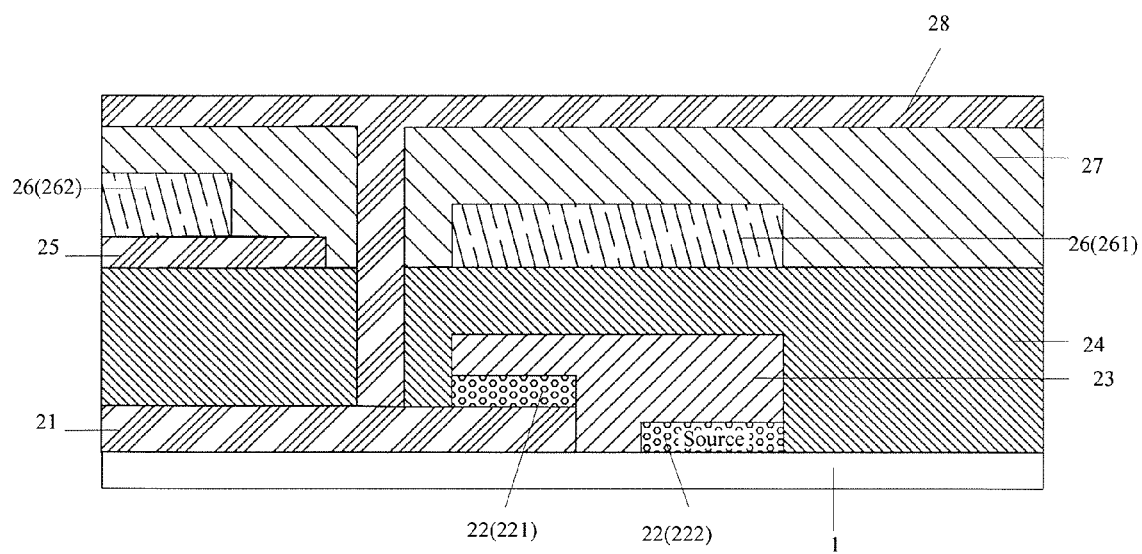
FIG. 2(b) is a schematic view showing an X-ray flat panel sensor provided by a first embodiment of the disclosure.

As shown in FIG. 2(b), the X-ray flat panel sensor of the embodiment includes a first ITO layer 21, a source-drain layer 22, an active layer 23, a passivation layer 24, a second ITO layer 25, a gate electrode 261 and a ground line 262, a resin layer 27, and a third ITO layer 28, which are formed on a base substrate 1 in sequence. The photodiode (not shown in the figure), for example, is formed in a structural layer over the first ITO layer 28 or is formed along with the active layer, and for example, occupies the area of the corresponding pixel unit as much as possible, and the photodiode is for example a PIN photodiode. The first ITO layer 21, the second ITO layer 25 and the third ITO layer 28 are examples of the first to third conductive layers, respectively; but the first to third conductive layers are not limited to cases where they are all formed of transparent conductive layers of such as ITO, and may be formed of other suitable conductive material as well.

The first ITO layer 21 contacts a part of the base substrate 1; a drain electrode 221 of the source-drain layer 22 contacts a part of the first ITO layer 21, a source electrode 222 of the source-drain layer 22 contacts a part of the base substrate 1; the active layer 23 contacts the source-drain layer 22 and the part of the base substrate 1 between the source electrode 222 and the drain electrode 221; the passivation layer 24 contacts a part of the first ITO layer 21, the entire active layer 23 and a part of the base substrate 1; the second ITO layer 25 contacts a part of the passivation layer 24, and the first ITO layer 21 and the second ITO layer 25 are disposed in opposition to each other so as to form a storage capacitor; the gate electrode 261 contacts a part of the passivation layer 24, the ground line 262 contacts a part of the second ITO layer 25, the gate electrode 261 is connected to a gate line (for example, they are formed integrally), and the ground line 262 forms, for example, a part of a common electrode line; the resin layer 27 contacts the entirety of the gate line and the gate electrode 261, and the ground line 262, a part of the second ITO layer 25, and a part of the passivation layer 24; the third ITO layer 28 contacts the entire resin layer 27, and contacts the first ITO layer 21 through a via hole penetrating the resin layer 27 and the passivation layer 24, and the third ITO layer 28 acts to transmit an electric signal towards outside. Here, the second ITO layer 25 and the third ITO layer 28 also overlap in part so as to form a part of the storage capacitor likewise; alternatively, they may not overlap also, and for example the third ITO layer 28 is not formed on the right side of FIG. 2(b). For example, the resin layer 27 may also be replaced with an inorganic insulating layer.

A top-gate TFT is employed in the present embodiment, namely, the gate electrode 261 is located over the active layer 23. For example, the ground line 262 and the gate electrode 261 as well as the gate line are formed through the same patterning process with the same material layer. The ground line 262 is formed on the second ITO layer 25, the first ITO layer 21 and the third ITO layer 28 are electrically connected through a via hole penetrating the passivation layer 24 and the resin layer 27, and therefore, only two insulating layers 24 and 27 need to be formed, and one process of producing an insulating layer is saved. Moreover, as there is only one passivation layer that is relatively thin between the first ITO layer 21 and the second ITO layer 25, larger storage capacitance can be obtained. The larger storage capacitance can reduce signal distortion caused by large leakage current of pixels, and also functions to improve the signal-to-noise ratio.

The base substrate 1 is, such as a glass substrate, a quartz substrate, or the like. Moreover, in the embodiment, although the first ITO layer and so on are formed directly over the base substrate 1, the following case may also be possible: a buffer layer or the like can be formed on the base substrate 1 firstly, and then other structures as mentioned above are formed on the buffer layer.

Embodiment 2

Figure 3:
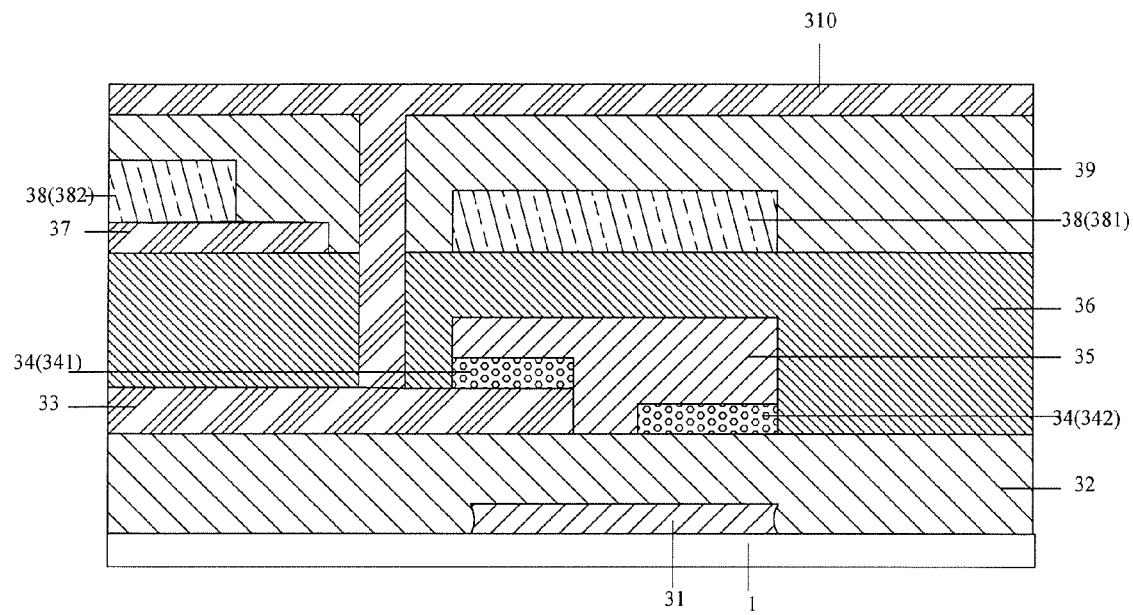
FIG. 3 is a schematic view showing an X-ray flat panel sensor provided by a second embodiment of the disclosure.

FIG. 3 shows an X-ray flat panel sensor provided by a second embodiment of the disclosure. Likewise, the X-ray flat panel sensor according to the embodiment comprises a plurality of gate lines and a plurality of data lines that are arranged to intersect each other, and a plurality of pixel units stated as above, which are formed by enclosing them with the gate lines and the data lines. For example, each of the pixel units includes a photosensitive element, a thin film transistor (TFT) and a storage capacitor, and for example, it has the equivalent circuit diagram as shown in FIG. 2(a). As shown in FIG. 3, the X-ray flat panel sensor includes a light shielding layer 31, a first passivation layer 32, a first ITO layer 33, a source-drain layer 34, an active layer 35, a second passivation layer 36, a second ITO layer 37, a gate electrode 381 and a ground line 382, a resin layer 39, and a third ITO layer 310, which are formed on a base substrate 1 in sequence. The first ITO layer 33, the second ITO layer 37 and the third ITO layer 310 are examples of the first to third conductive layers, respectively; but the first to third conductive layers are not limited to cases where they are all formed of transparent conductive layers of such as ITO, and may be formed of other suitable conductive material as well. A photodiode (not shown in the figure), for example, is formed in a structural layer over the third ITO layer 310 or is formed along with the active layer, and for example, occupies the area of a corresponding pixel unit as much as possible, and the photodiode is for example a PIN photodiode.

The light shielding layer 31 contacts a part of the base substrate 1; the first passivation layer 32 contacts the entire light shielding layer 31 and a part of the base substrate 1; the first ITO layer 33 contacts a part of the first passivation layer 32; a drain electrode 341 of the source-drain layer 34 contacts a part of the first ITO layer 33, and a source electrode 342 of the source-drain layer 34 contacts a part of the first passivation layer 32; the active layer 35 contacts the entire source-drain layer 34 and the part of the first passivation layer 32 between the source electrode 342 and the drain electrode 341; the second passivation layer 36 contacts a part of the first ITO layer 33, the entire active layer 35, and a part of the first passivation layer 32; the second ITO layer 37 contacts a part of the second passivation layer 36, and the first ITO layer 33 and the second ITO layer 37 are disposed in opposition to each other so as to form a storage capacitor; the gate electrode 381 contacts a part of the second passivation layer 36, the ground line 382 contacts a part of the second ITO layer 37, and the gate electrode 381 is connected to a gate line (for example, they are formed integrally); the resin layer 39 contacts the entirety of the gate line and the gate electrode 381, and the ground line 382, a part of the second ITO layer 37, and a part of the second passivation layer 36; the third ITO layer 310 contacts the entire resin layer 39, and contacts the first ITO layer 33 through a via hole penetrating the resin layer 39 and the second passivation layer 36. Here, the second ITO layer 37 and the third ITO layer 310 also overlap in part so as to form a part of the storage capacitor likewise; alternatively, they may not overlap as well, and for example, the third ITO layer 310 is not formed on the right side of FIG. 3. For example, the resin layer 39 may also be replaced with an inorganic insulating layer.

In the present embodiment, only two insulating layers need to be formed, and one process of producing an insulating layer is saved, and moreover, for the sake of avoiding the disadvantageous effect from underlying photocarriers on the leakage current of pixels, at the beginning, a metal layer or a resin layer is formed on a glass substrate for light shielding. One preferred method is that, a material that may be the same as the material (e.g. a black resin layer or a chromium oxide layer) for a black matrix on a color filter substrate is used to shield the active layer, as shown in FIG. 3. In order to prevent electrical conduction between the source and drain electrodes through the metal layer, a PVX layer can be further added.

The base substrate 1 is for example a glass substrate, a quartz substrate, or the like. Moreover, in the embodiment, although the first ITO layer and so on are formed directly on the base substrate 1, the following case may also be possible: a buffer layer or the like is formed on the base substrate 1 firstly, and then other structures as mentioned above are formed on the buffer layer.

Taking the structure shown in FIG. 3 as an example, a process flow of producing the X-ray flat panel sensor according to the embodiment of the disclosure will be given below, and it may include the following steps:

Step 1. A light shielding layer is formed on a base substrate through a first patterning process;

Step 2. A first passivation layer (PVX) is deposited, and then a first ITO layer is formed on the passivation layer through a second patterning process;

Step 3. Through a third patterning process, a source-drain layer that includes a source electrode and a drain electrode separated from each other is formed;

Step 4. Through a fourth patterning process, an active layer is formed to cover the source and drain electrodes;

Step 5. A second layer (PVX) is deposited, and then a second ITO layer is formed on the second layer (PVX) through a fifth patterning process;

Step 6. A gate line and a ground line are formed through a sixth patterning process;

Step 7. Through a seventh patterning process, a third passivation layer (e.g., an inorganic insulating layer or an organic insulating layer) is formed, and a via hole is formed passing through the second and third passivation layers;

Step 8. Through a eighth patterning process, a third ITO layer that is connected to the first ITO layer through the via hole is formed on the third passivation layer.

A patterning process is for example a photolithographic patterning process, which comprises the following process. After a structural layer is formed, a photoresist layer is coated on the structural layer to be patterned, exposure is conducted on the photoresist layer with a mask plate, and the exposed photoresist layer is developed to obtain a photoresist pattern, etching is conducted on the structural layer with the photoresist pattern, and then, the photoresist pattern is removed optionally.

The first to third ITO layers are examples of the first to third conductive layers, respectively; but the first to third conductive layers are not limited to cases where they are all formed of transparent conductive layers of such as ITO, and may be formed of other suitable conductive material as well. For example, the ITO layers may be replaced with a layer of indium zinc oxide (IZO), IGZO (indium gallium zinc oxide), or the like.

Embodiment 3

Figure 4:
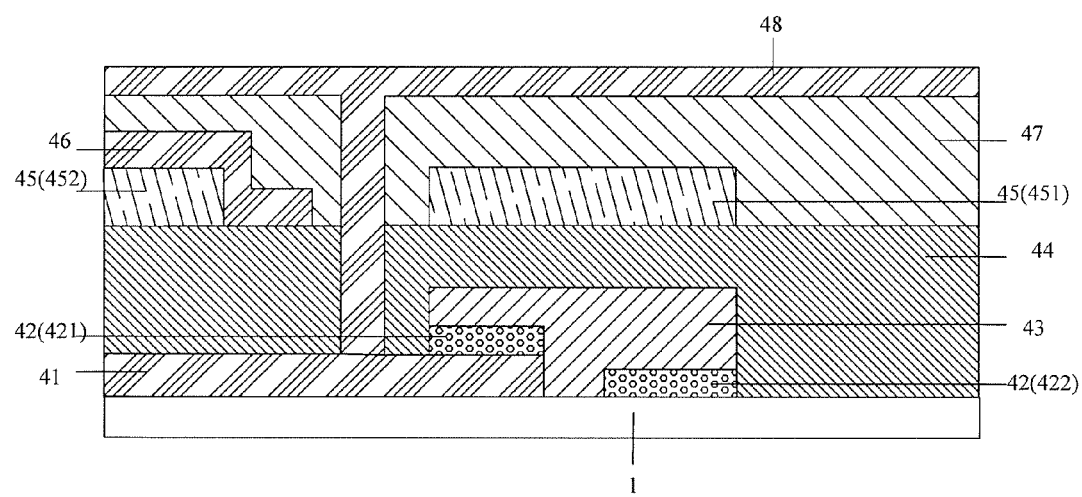
FIG. 4 is a schematic view showing an X-ray flat panel sensor provided by a third embodiment of the disclosure.

FIG. 4 shows an X-ray flat panel sensor provided by a third embodiment of the disclosure. Likewise, the X-ray flat panel sensor according to the present embodiment comprises a plurality of gate lines and a plurality of data lines that are arranged to intersect each other, and a plurality of pixel units stated as above, which are formed by enclosing them with the gate lines and the data lines. For example, each of the pixel units includes a photosensitive element, a thin film transistor (TFT) and a storage capacitor, and for example, the pixel unit has the equivalent circuit diagram as shown in FIG. 2(a). As shown in FIG. 4, the X-ray flat panel sensor includes a first ITO layer 41, a source-drain layer 42, an active layer 43, a passivation layer 44, a gate electrode 451 and a ground line 452, a second ITO layer 46, a resin layer 47, and a third ITO layer 48, which are formed on a base substrate 1 in sequence. The first ITO layer 41, the second ITO layer 46 and the third ITO layer 48 are examples of the first to third conductive layers, respectively; but the first to third conductive layers are not limited to cases where they are all formed of transparent conductive layers of such as ITO, and may be formed of other suitable conductive material as well. A photodiode (not shown in the figure), for example, is formed in a structural layer over the third ITO layer 48 or is formed along with the active layer, and for example, occupies the area of a corresponding pixel unit as much as possible, and the photodiode is for example a PIN photodiode.

As shown in the drawing, the first ITO layer 41 contacts a part of the base substrate 1; a drain electrode 421 of the source-drain layer 42 contacts a part of the first ITO layer 41, a source electrode 422 of the source-drain layer 42 contacts a part of the base substrate 1, and preferably, a material having low resistivity (e.g., a copper or aluminum material) is used for fabrication of the source and drain electrodes; the active layer 23 contacts the entire source-drain layer 42 and the part of the base substrate 1 between the source electrode 422 and the drain electrode 421; the passivation layer 44 contacts a part of the first ITO layer 41, the entire active layer 43, and a part of the base substrate 1; the gate electrode 451 and the ground line 452 contact a part of the passivation layer 44, respectively, the gate electrode 451 is connected to a gate line (for example, they are formed integrally), preferably, and a material having low resistivity (e.g. a copper or aluminum material) is used for fabrication of the gate electrode and the gate line so that the resistance of the TFT can be reduced; the second ITO layer 46 contacts the ground line 452 and a part of the passivation layer 44, and the first ITO layer 21 and the second ITO layer 25 form a storage capacitor; the resin layer 47 contacts the entire second ITO layer 46, the gate electrode 451, and a part of the passivation layer 44; the third ITO layer 48 contacts the entire resin layer 47, and contacts the first ITO layer 41 through a via hole penetrating the resin layer 47 and the passivation layer 44. Here, the second ITO layer 46 and the third ITO layer 48 also overlap in part, so as to form a part of the storage capacitor similarly; alternatively, they may not overlap as well, for example, the third ITO layer 48 is not formed on the right side of FIG. 4. For example, the resin layer 47 may also be replaced with an inorganic insulating layer.

The base substrate 1 is for example a glass substrate, a quartz substrate, or the like. Moreover, in the embodiment, although the first ITO layer and so on are formed directly on the base substrate 1, the following case may also be possible: a buffer layer or the like is formed on a base substrate 1 firstly, and then other structures are formed over the buffer layer.

Embodiment 4

Figure 5:
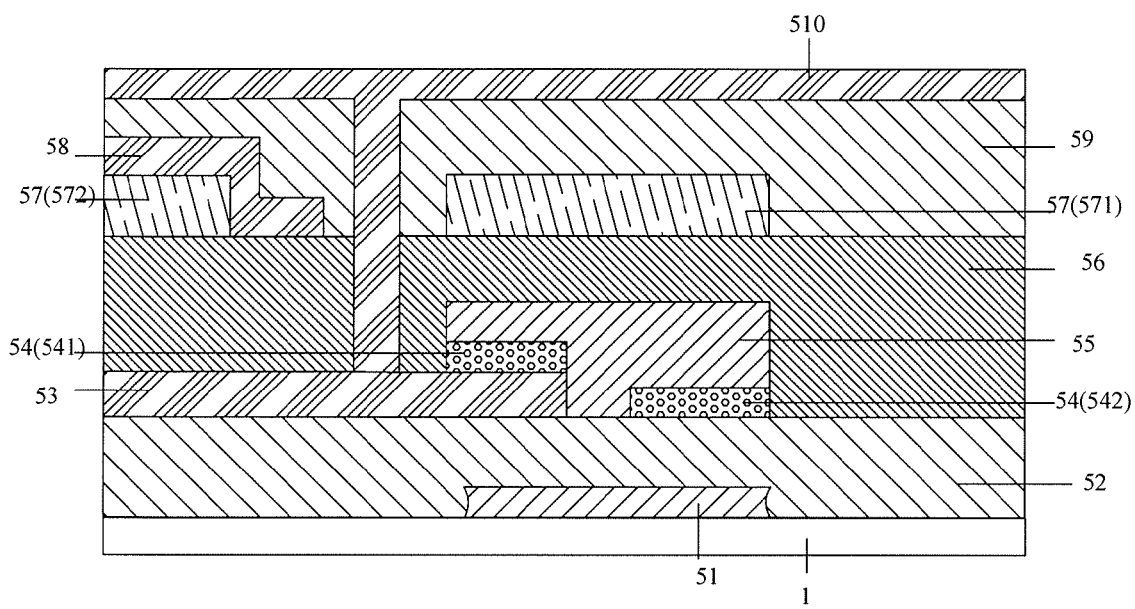
FIG. 5 is a schematic view showing an X-ray flat panel sensor provided by a fourth embodiment of the disclosure.

FIG. 5 shows an X-ray flat panel sensor provided by a fourth embodiment of the disclosure. Likewise, the X-ray flat panel sensor according to the embodiment comprises a plurality of gate lines and a plurality of data lines that are arranged to intersect each other, and a plurality of pixel units stated as above, which are formed by enclosing them with the gate lines and the data lines. For example, each of the pixel units includes a photosensitive element, a thin film transistor (TFT) and a storage capacitor, and for example, the pixel unit has the equivalent circuit diagram shown in FIG. 2(a). As shown in FIG. 5, the X-ray flat panel sensor includes a light shielding layer 51, a first passivation layer 52, a first ITO layer 53, a source-drain layer 54, an active layer 55, a second passivation layer 56, a gate electrode 571 and a ground line 572, a second ITO layer 58, a resin layer 59, and a third ITO layer 510, which are formed on a base substrate 1 in sequence. The first ITO layer 33, the second ITO layer 37 and the third ITO layer 310 are examples of the first to third conductive layers, respectively; but the first to third conductive layers are not limited to cases where they are all formed of transparent conductive layers of such as ITO, and may be formed of other suitable conductive material as well. A photodiode (not shown in the figure), for example, is formed in a structural layer over the third ITO layer 310 or is formed along with the active layer, and for example, occupies the area of a corresponding pixel unit as much as possible, and the photodiode is for example a PIN photodiode.

As shown in the drawing, the light shielding layer 51 contacts a part of the base substrate 1; the first passivation layer 52 contacts the entire light shielding layer 51 and a part of the base substrate 1; the first ITO layer 53 contacts a part of the first passivation layer 52; a drain electrode 541 of the source-drain layer 54 contacts a part of the first ITO layer 53, a source electrode 542 of the source-drain layer 54 contacts a part of the first passivation layer 52; the active layer 55 contacts the entire source-drain layer 54 and the part of the first passivation layer 52 between the source electrode 542 and the drain electrode 541; the second passivation layer 56 contacts a part of the first ITO layer 53, the entire active layer 55 and a part of the first passivation layer 52; the gate electrode 571 and the ground line 572 contact a part of the second passivation layer 56, respectively, and the gate electrode 571 is connected to a gate line (for example, they are formed integrally); the second ITO layer 58 contacts the ground line 572 and a part of the second passivation layer 56; the resin layer 59 contacts the entire second ITO layer 58, the gate electrode 571 and a part of the second passivation layer 56; the third ITO layer 510 contacts the entire resin layer 59, and contacts the first ITO layer 53 through a via hole penetrating the resin layer 59 and the second passivation layer 56. Here, the second ITO layer 58 and the third ITO layer 510 also overlap in part, so as to form a part of a storage capacitor likewise; alternatively, they may not overlap as well, and for example, the third ITO layer 510 is not formed on the right side of FIG. 5. For example, the resin layer 59 may also be replaced with an inorganic insulating layer.

In the present embodiment, the ground line is formed under the second ITO layer, and according to the different types of used etching liquids, the second ITO layer may be formed on the ground line directly. Of course, depending on the production line technique, it is also possible that a protective layer (PVX) needs to be further additionally formed over the ground line and in this way the second ITO layer can be formed then. For example, use of an acid etching liquid will affect the ground line, and thus, a protective layer (PVX) needs to be formed, and then the second ITO layer is formed.

The base substrate 1 is for example a glass substrate, a quartz substrate, or the like. Moreover, in the embodiment, although the first ITO layer and so on are formed directly over the base substrate 1, the following case may also be possible: a buffer layer and so on are formed on a base substrate 1 firstly, and then other structures are formed on the buffer layer.

The X-ray flat panel sensor according to the embodiment of the disclosure further comprises a photoelectric conversion structure (e.g., a photodiode), and for example, the photoelectric conversion layer is formed of a semiconductor silicon material, such as, a polysilicon material.

It is to be noted that, as to the expression about partial contact or entire contact in the embodiments of the disclosure, it is described from the top-to-bottom perspective in the sectional views.

(1) According to the embodiments of the disclosure, the top-gate TFT structure is employed, the first conductive layer is used to overlap the source-drain layer directly; and as compared to a bottom-gate TFT structure, the passivation layer (PVX layer) that is to be added when a source-drain layer is connected to a first conductive layer is not needed any more. Furthermore, according to the embodiments of the disclosure, the ground line and the gate electrode can be finished in one patterning process, thereby reducing the amount of the processes and enhancing yield of products.

(2) According to the embodiments of the disclosure, the damage to the active layer incurred by such as X ray can be blocked by a gate line and so on (a gate metal layer), so that usage life of the TFT can be prolonged, and in turn, the usage life of the flat panel detector can be prolonged.

(3) According to the embodiments of the disclosure, the source-drain layer metal can be formed by using a low-resistivity metal material, thereby reducing resistance of the TFT. Because resistance of the TFT has relatively big influence on the response time of the flat panel detector, the response time of the flat panel detector is effectively shortened.

(4) The ground line and the gate line are formed on the same layer, and resistance of the ground line can be reduced by using a low-resistivity metal material (e.g., aluminum, or the like), thereby improving the signal-to-noise ratio of the detector.

(5) The first conductive layer and the second conductive layer overlap to form the storage capacitor, and the first conductive layer collects charges that are obtained through conversion of such as X-ray. As there is only one passivation layer that is relatively thin between the first conductive layer and the second conductive layer, larger storage capacitance can be obtained, and the larger storage capacitance can reduce a signal distortion caused by large leakage current of pixels, and also functions to improve the signal-to-noise ratio.

The embodiments of the disclosure being thus described, it will be obvious that the same may be varied in many ways. Such variations are not to be regarded as a departure from the spirit and scope of the disclosure, and all such modifications as would be obvious to those skilled in the art are intended to be included within the scope of the following claims.

What is claimed is:

1. A flat panel sensor, comprising:
   a base substrate;
   a top-gate thin film transistor (TFT) that includes a gate electrode, a source electrode, a drain electrode and an active layer; and
   a storage capacitor that are formed on the base substrate,
   wherein the storage capacitor includes a first conductive layer, a second conductive layer disposed in opposition to the first conductive layer, a third conductive layer for output of an electric signal, and a ground line;
   wherein the first conductive layer is directly connected to the drain electrode of the top-gate TFT, the gate electrode of the top-gate TFT is disposed between the first conductive layer and the third conductive layer, the second conductive layer is directly connected to the ground line, and the third conductive layer is connected to the first conductive layer through a via hole; and
   wherein the second conductive layer is provided above the first conductive layer, and the third conductive layer is provided above the second conductive layer.

2. The flat panel sensor of claim 1, wherein the ground line is disposed on the same layer as a gate electrode of the top-gate TFT.

3. The flat panel sensor of claim 1, wherein the ground line is formed on the second conductive layer and electrically contact with the second conductive layer.

4. The flat panel sensor of claim 1, further comprising a light shielding layer disposed in a region corresponding to the top-gate TFT.

5. The flat panel sensor of claim 4, wherein the light shielding layer is disposed on the base substrate and located under the active layer.

6. The flat panel sensor of claim 1, wherein the active layer is an amorphous silicon layer or a polysilicon layer.

7. The flat panel sensor of claim 1, wherein the gate electrode of the top-gate TFT is formed of an aluminum material or a copper material.

8. The flat panel sensor of claim 1, wherein the first conductive layer, the second conductive layer and the third conductive layer are all transparent conductive layers.

9. The flat panel sensor of claim 1, wherein the second conductive layer and the third conductive layer are disposed in opposition to each other at least in part.

10. A flat panel detector, comprising the flat panel sensor of as claim 1.

11. The flat panel sensor of claim 1, wherein the active layer is formed above the source electrode, the drain electrode and the first conductive layer.

12. The flat panel sensor of claim 1, wherein the drain electrode is formed above the first conductive layer and between the first conductive layer and the third conductive layer.

* * * * *